United States Patent [19]

Shinozaki et al.

[11] Patent Number: 5,233,620
[45] Date of Patent: Aug. 3, 1993

[54] SECOND-HARMONIC GENERATING APPARATUS

[75] Inventors: Keisuke Shinozaki; Saeko Oshiba; Takeshi Kamijoh, all of Tokyo, Japan

[73] Assignee: Oki Electric Industry Co., Ltd., Tokyo, Japan

[21] Appl. No.: 750,637

[22] Filed: Aug. 27, 1991

[30] Foreign Application Priority Data

Aug. 29, 1990 [JP] Japan .................. 2-227187

[51] Int. Cl.$^5$ .............................................. H01S 3/10
[52] U.S. Cl. ........................................ 372/22; 372/20; 372/21; 372/64; 372/100; 359/328
[58] Field of Search .................... 359/328; 372/18, 20, 372/21, 22, 99, 97, 64, 100; 385/122

[56] References Cited

U.S. PATENT DOCUMENTS

| | | | |
|---|---|---|---|
| 4,910,738 | 3/1990 | Fujita et al. | 372/18 |
| 4,959,665 | 9/1990 | Saito et al. | 372/22 |
| 5,036,220 | 7/1991 | Byer et al. | 359/328 |
| 5,068,546 | 11/1991 | Hemmerich et al. | |
| 5,082,340 | 1/1992 | Aoshima et al. | 359/328 |

FOREIGN PATENT DOCUMENTS 9102316.5  6/1991  Fed. Rep. of Germany .

OTHER PUBLICATIONS

Dahmani et al., "Frequency Stabilization of Semiconductor Lasers by Resonant Optical Feedback", Optics Letters, vol. 12, No. 11, Nov. 1987.
Dixon et al., "432-nm Source Based on Efficient Second-Harmonic Generation of GaAlAs Diode-Laser Radiation in A Self-Locking External Resonant Cavity", Optics Letters, vol. 14, #14, Jul;. 15, 1989.
Chun et al., "Second-Harmonic Generation at 421 nm Using Injection-Locked GaAlAs Laser Array and KnbO$_3$", 320 Applied Physics Letters, 53 (1988), 26 Sep., No. 13.
Gorokhov et al., "Extraction of Second-Harmonic Radiation from a Laser Resonator", 8164 Instruments and Experimental Techniques, vol. 15, 1972, Nov./Dec.
Patent Abstracts of Japan, vol. 13, No. 142 (E-739) 7 Apr. 1989 & JP-A-63 394 686 (Brother Ind. Ltd.) Abstract.
Soviet Journal of Quantum Electronics, vol. 1, No. 5, Apr. 1972, New York, pp. 547-549; V. I. Kravchenko et al., "Frequency tuning and high-efficiency extraction of second-harmonic radiation from a prism dispersion . . .".
Lim et al., "Second-Harmonic Generation of Green Light in Periodically poled planar lithium Niobate Waveguide" Electronics Letters, Feb. 2, 1989, vol. 25, No. 3
Oshiba et al., "Widely Tunable Semiconductor Optical Fiber Ring Laser", Applied Physics Letters, vol. 55, No. 23, Dec. 4, 1989.
Somekh et al., "Phase Matching By Periodic Modulation Of The Nonlinear Optical Properties", Optics Communications, Nov. 1972, vol. 6, No. 3.

Primary Examiner—Jr. Scott
Attorney, Agent, or Firm—Spencer, Frank & Schneider

[57] ABSTRACT

A second-harmonic generating device includes a laser diode for providing light of a fundamental wave, having end-facets at least one being an antireflection coated end-facet. An optical reflector forms an external resonator with one of the end-facets of the laser diode whereby a portion of the light from the laser diode is returned by the reflector to the laser diode. A second-harmonic generation element is disposed between the laser diode and the optical reflector, for producing a second-harmonic of the fundamental wave while the fundamental wave propagates in the second-harmonic generation element. In this way, the optical reflector determines the wavelength of the light of the fundamental wave so that the laser diode produces light with a wavelength satisfying a phase matching condition of the second-harmonic generation element.

12 Claims, 4 Drawing Sheets

SECOND-HARMONIC GENERATING APPARATUS

FIELD OF THE INVENTION

The present invention relates to an apparatus for generating a second-harmonic of a fundamental wave.

BACKGROUND OF THE INVENTION

An element employed for the second-harmonic generation (SHG) is described, for example, in Electronics Letters, Vol. 25, (1989), PP. 731-732. Its operation is based on a quasi-phase matching method.

Referring to FIG. 1, quasi-phase matching will be described. FIG. 1 shows an waveguide-type SHG element. Titanium is diffused in stripes at the +C surface of LiNbO$_3$ substrate 10, so that domain-reversal regions 12 are formed with a spatial period $\Lambda$. An optical waveguide 14 is formed orthogonally to the domain-reversal regions 12 by a proton exchanging method (Li$^+$ —H$^+$ exchanging method).

In FIG. 1, a fundamental wave (angular frequency: $\omega$, wavelength: $\lambda(\omega)$) enters the SHG element. Then the fundamental wave propagates in the light waveguide 14. During propagation, energy of the fundamental wave is partially converted to a second-harmonic angular frequency: $2\omega$, wavelength: $\lambda(2\omega)$).

If the SHG element did not have the domain-reversal regions 12, the maximum power of the second-harmonic would be obtained when the fundamental wave goes up to the coherence length $l_c$ according to the following equation (1).

$$l_c = \frac{\lambda(\omega)}{4(Nn(2\omega) - Nm(\omega))} \quad (1)$$

Wherein, Nn($2\omega$) is an effective guide index of the second-harmonic in the n-th propagation mode, and Nm($\omega$) is the index of the fundamental wave in the m-th propagation mode.

For example, the coherence length $l_c$ is approximately 1.7 $\mu$m, when both propagation modes are 0-th (m=n=0), $\lambda(\omega)$ is 830 nm, and thickness d of the light waveguide 14 is 1 $\mu$m.

In this case, the second-harmonic has maximum power at the first 1.7 $\mu$m in the waveguide 14, and has none at the next 1.7 $\mu$m. That is, even though the fundamental wave is longer than $l_c$, power of the second-harmonic does not exceed a certain quantity. This comes from an incomplete phase-matching between the fundamental wave and the second-harmonic.

A phase-mismatching $\Delta k$ is obtained according to the following equation.

$$\Delta k = \frac{4\pi}{\lambda(\omega)} (N(2\omega) - N(\omega))$$

In order to correct the phase-mismatching $\Delta k$, the domain reversal regions 12 are formed with the spatial period $\Lambda(=2 l_c)$ as shown in FIG. 2. Thereby the power of the second-harmonic is approximately proportional to the square of the propagation length.

To correct $\Delta k$ completely, the following equation (2) is indicated in Optics Communications Vol. 6, 1972, pp. 301-302.

$$N(2\omega) - N(\omega) - \lambda(2\omega)/\Lambda = 0 \quad (2)$$

Thus, when the domain reversal regions 12 are formed so as to satisfy equation (2), although the phases don't match each other, the second harmonic has power proportional to the square of the SHG element's length L.

However, it is difficult to satisfy equation (2), since the effective guide indices N($2\omega$) and N($\omega$) depend on dimensions of the light waveguide 14. Accuracy of these dimensions and also of the spatial period $\Lambda$ are still insufficient nowadays.

A dye laser is considered for a light source in the Optics Communications article Although it has the ability to change wavelength, the complete apparatus is not of compact size.

SUMMARY OF THE INVENTION

It is an object of the present invention to provide a second-harmonic generating apparatus which is compact and oscillates a high-power laser light.

According to the present invention, a laser diode is employed for a light source, and an external resonator consists of the laser diode and a diffraction grating. An SHG element is disposed in the middle of the resonator. Controlling a diffraction angle of the grating, the best wavelength of the fundamental wave is selected so as to maximize the conversion rete of the second harmonic.

Therefore, it is possible to change the wavelength of the oscillation of the laser diode so as to agree with the phase-matching condition of the SHG element.

BRIEF DESCRIPTION OF THE DRAWING

The objects and features of the present invention will become more apparent from a consideration of the following detailed description taken in conjunction with the accompanying drawings in which.

DESCRIPTION OF THE PREFERRED EMBODIMENT

Figure 2:
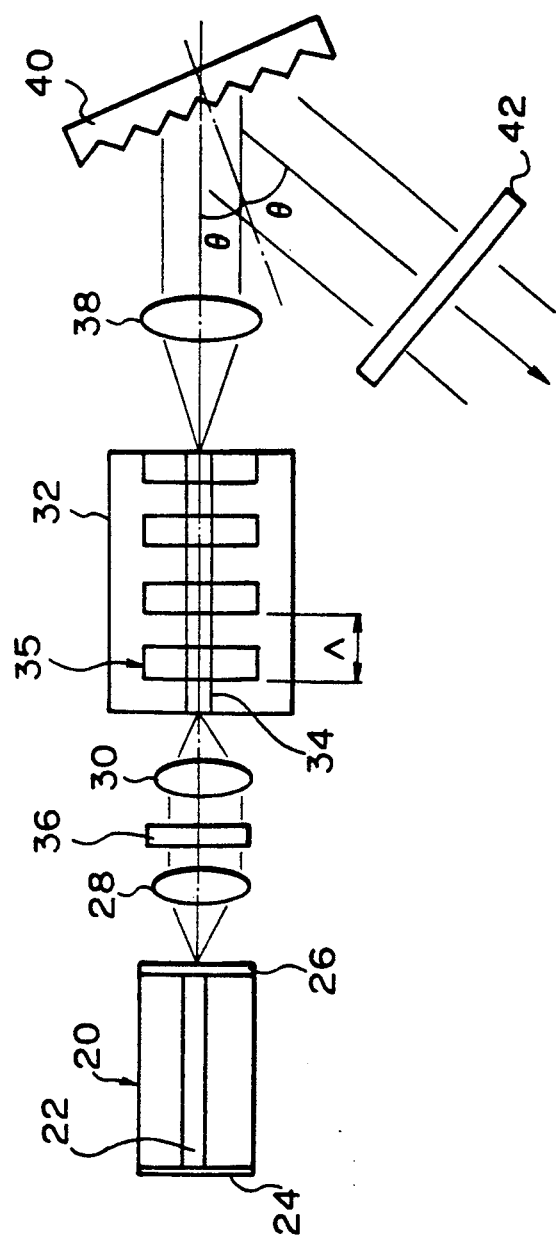
FIGS. 2 and 3 are schematic plan views of first and second embodiments according to the invention.

The first embodiment according to the present invention is illustrated in FIG. 2.

In FIG. 2, the apparatus comprises a semiconductor laser diode 20, a waveguide-type SHG element 32 and an optical reflector 40.

Figure 1:
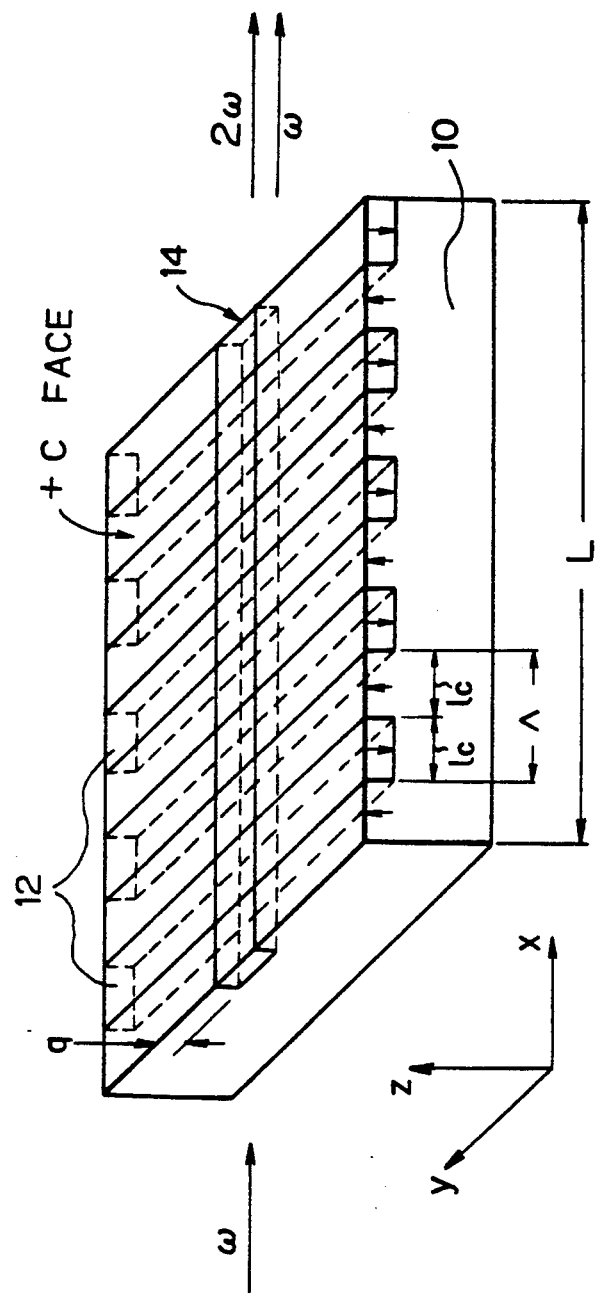
FIG. 1 is a oblique view of an waveguide-type SHG element employed for second-harmonic generation.

The SHG element 32 has the same structure as the one shown in FIG. 1. Domain reversal regions 35 are formed with a period $\Lambda$, and an optical waveguide 34 is formed orthogonally to the regions 35. LiNbO$_3$, KTiOPO$_4$ or another appropriate substrate is used for the element 32.

The semiconductor laser diode 20 is employed as a light source. The laser diode 20 has a high reflection (HR) coated end facet 24 and an antireflection (AR) coated end facet 26, at opposite ends of the active region 22. The HR coated end-facet 24 desirably has 100% reflectance. And the reflectance of the AR coated end-faset 26 should be less than 10$^{-4}$ in order to obtain a high power second-harmonic.

A light from the laser diode 20 enters the optical waveguide 34 of the SHG element 32. Since the light is emitted from the AR coated end facet 26 in TM-mode, it is desirable to rotate the plane of the electric field 90 degrees using a half-wave plate 36. Thereby a fundamental wave entering the waveguide 34 has larger energy.

The fundamental wave from the SHG element 32 is collimated with lens 38, then enters the optical reflector 40 which has the selectivity of a wavelength. In the first embodiment, a diffraction grating is employed for the reflector 40. The HR coated end-facet 24 of the laser diode 20 and the diffraction grating 40 form an external resonator. An optical filter 42 is employed in order to black the fundamental wave.

Disposing the diffraction grating 40 so as to satisfy the following equation (3), a wavelength $\lambda(\omega)$ of the fundamental wave is defined as an oscillation wavelength of the laser diode 20.

$$d \sin \theta = \lambda(\omega) \quad (3)$$

Wherein d is the lattice constant of the grating 40, and $\theta$ is the diffraction angle of the grating 40.

Consequently the oscillation wavelength $\lambda(\omega)$ of the laser diode 20 is selected by changing $\theta$. In addition, by controlling $\theta$, it is possible to satisfy a condition of the quasi-phase matching according to the equation (2), because the effective guide indices $N(2\omega)$ and $N(\omega)$ are functions of the wavelength $\lambda(\omega)$ of the fundamental wave.

The range of the oscillation wavelength by controlling $\theta$ is a gain-width of the active region 22 of the laser diode 20, and is above 100 nm. In this range, it is possible with current technology to fabricate an SHG element 32 which satisfies the quasi-phase matching condition.

When upper and a lower electrodes (not illustrated) of the laser diode 20 are applied with a prescribed voltage, the laser diode 20 oscillates. Light emitted from the AR coated end-facet 26 enters to the waveguide 34 of the SHG element 32 through the optical system (28, 36 and 30). After propagating in the waveguide 34, and passing through a lens 38, the light enters the diffraction grating 40 with diffraction angle $\theta$ satisfying the condition of the equation (3).

Then a part of the light is reflected by the grating 40 and returns to the laser diode 20. The wavelength of the reflected light is the wavelength $\lambda(\omega)$ of the fundamental wave. As a result, the condition of the equation (2) is satisfied completely. So resonance at the fundamental wave occurs, and laser oscillation with high power is obtained.

While the fundamental wave propagates in the waveguide 34, a part of the energy of the fundamental wave is converted to a second-harmonic. The second-harmonic has half the wavelength and twice the frequency ($\lambda(2\omega)$) of the fundamental wave.

The second-harmonic and non-converted fundamental wave are both partially diffracted by the grating 40. The diffracted waves leave the resonator and, then the second-harmonic is selected by the optical filter 42.

According to the first embodiment, by controlling the diffraction angle $\theta$ of the grating 40, it is possible to select the best wavelength of the fundamental wave so as to maximize the conversion rate for the second harmonic.

In addition, the external resonater consisting of the laser diode 20 and the grating 40 is on the order of a couple of cm in length so that a distance of the oscillation longitudinal-mode is merely about 0.001 nm. Thus, actually, the control of the oscillation wavelength can be performed continuously.

Figure 3:
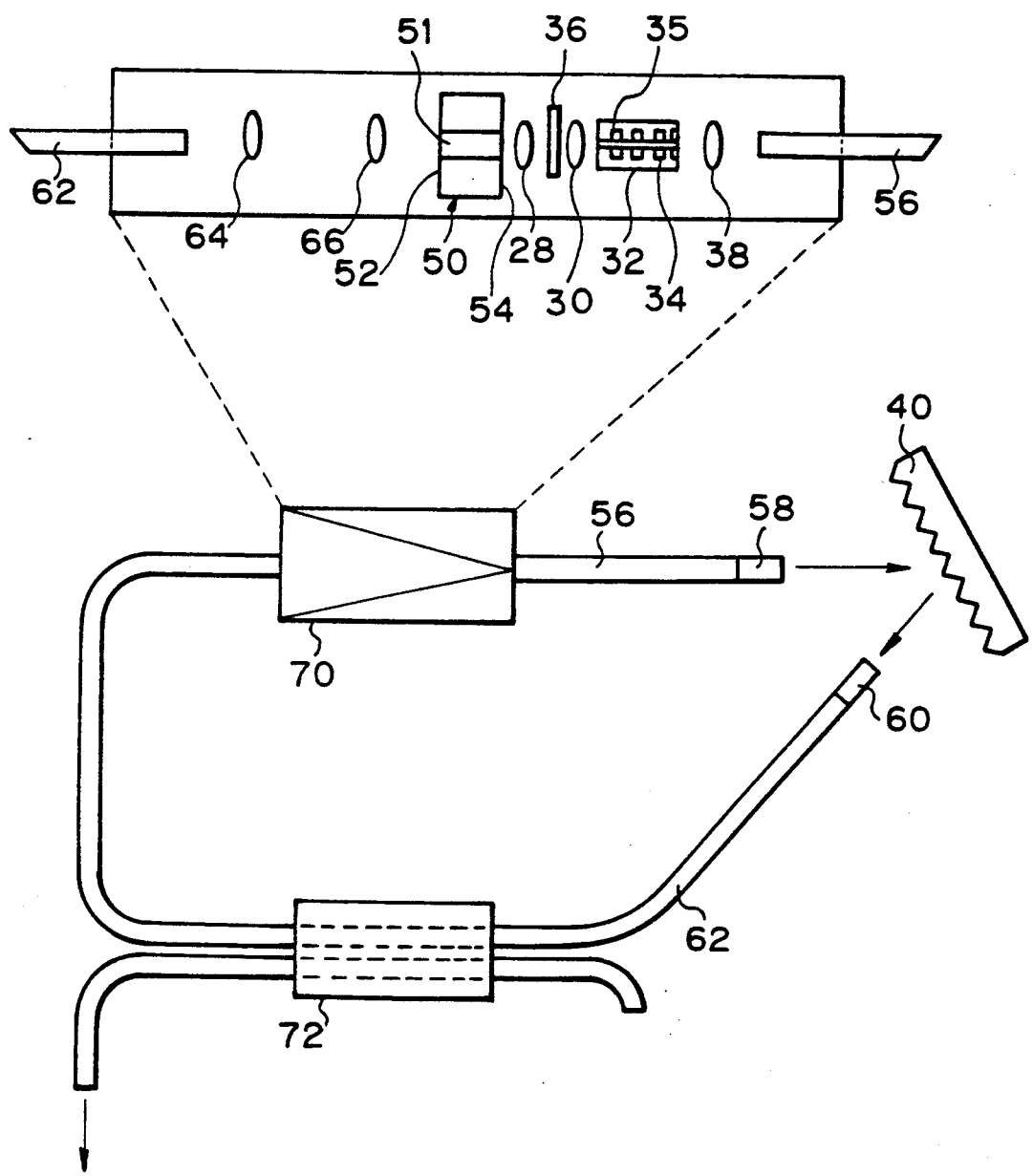

The second embodiment according to the present invention is illustrated in FIG. 3. Some of the same reference numbers are used for the same portions shown in FIG. 2.

In FIG. 3, an SHG unit 70 comprises a laser diode 50 and the SHG element 32. In the same way of the first embodiment, the lenses 28, 30 and the half-wave plate 36 are disposed between them. The SHG unit 70, the diffraction grating 40 an optical fibers 56, 62 construct a loop resonator.

In the second embodiment, the laser diode 50 has an active region 51 and two AR coated end facets 52, 54. Although the laser diode 50 doesn't oscillate by itself, light emitted from the laser diode 50 comes back through the loop, and because of the feedback system, laser oscillation occurs.

One end of the optical fiber 56 is coupled to the SHG element 32 through the lens 38, and one end of the optical fiber 62 is coupled to the laser diode 50 through the lenses 64, 66. The other ends of the optical fibers 56 and 62 are optically connected by the diffraction grating 40 which selects a wavelength. Graded index (GRIN) lenses 58 and 60 are put on the connection ends of the optical fiber 56 and 62.

The optical fibers 56 and 62 may be of type for keeping a plane of polarization.

When the laser diode 50 is provided with a prescribed voltage, emitted light from the AR coated end facet 54 enters the SHG element 32, through the lens 28, half-wave plate 36 and lens 30. The light propagates in the SHG element 32, and enters the optical fiber 56.

Then the light is formed parallel (collimated) by the GRIN lens 58 and enters the grating 40. The wavelength-selected light from the grating 40 enters the optical fiber 62 through the GRIN lens 60. The light propagates in the optical fiber 62 and returns to the laser diode 50.

In the middle of the optical fiber 62, a directional coupler 72 is disposed. Thus, light is coupled out of the loop through the directional coupler 72. In addition, by using an optical filter such as in the first embodiment, the second-harmonic may be selected.

According to the second embodiment too, by controlling the diffraction angle $\theta$ of the grating 40, it is possible to select the best wavelength so as to maximize the conversion rate of the second-harmonic. Particularly, the optical fibers employed in the second embodiment are convenient to take out the second-harmonic.

In addition, since the diffraction grating 40 has high wavelength-selectivity, it is possible to make narrow a spectral full width at half maximum (FWHM) of the fundamental wave less than 1 nm.

Figure 4B:
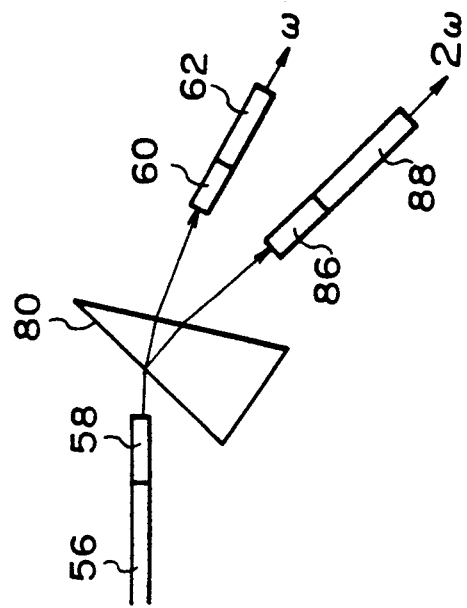
FIGS. 4A and 4B relate to modifications of the first and second embodiments according to the invention.
Figure 4A:
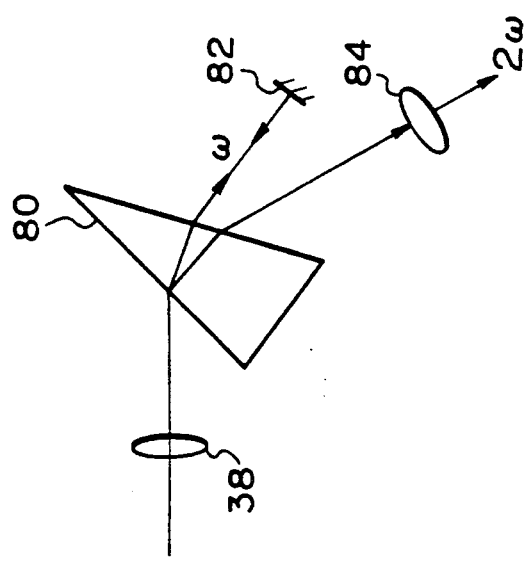

Referring to FIGS. 4A and 4B, modifications of the first and second embodiments are described. They employ a prism instead of the diffraction grating for selecting a wavelength so these figures only show the wavelength selection.

FIG. 4A shows a modification of the first embodiment. By using a prism 80, the fundamental wave ($\omega$) and the second-harmonic ($2\omega$) are completely separated. A mirror 82 for reflecting the fundamental wave is required to form the external resonator. A lens 84 may be employed for the second-harmonic.

FIG. 4B shows a modification of the seocond embodiment. The prism 80 separates the fundamental wave ($\omega$) and the second-harmonic ($2\omega$). These waves are respectively introduced to the optical fibers 62 and to an additional optical fiber 88. The fiber 88 may have a GRIN lens 86 at the introducing end.

As described above, according to the present invention, it is possible to select the wavelength of oscillation of the laser diode so as to agree with the phase-matching condition of the SHG element. Therefore, although the dimensions of the SHG element may not be precisely accurate, the quasi-phase matched SHG is realized by the technique of fundamental wave selection according to the invention.

Further, since a laser diode is employed for the light source, a compact apparatus can be provided.

The second-harmonic generating apparatus according to the present invention can be used as an optical recorder, an interferometer, or other device which needs light having a short wavelength and high-power.

What is claimed is:

1. A second-harmonic generating apparatus comprising:
   a laser diode for providing light of a fundamental wave, having a high reflection coated end-facet and an antireflection coated end-facet;
   an optical reflector for forming an external resonator with said high reflection coated end-facet of said laser diode whereby a portion of the light from said laser diode is returned by said optical reflector to said laser diode; and
   second-harmonic generation means, disposed between said antireflection coated end-facet of said laser diode and said optical reflector, for producing a second-harmonic of said fundamental wave while said fundamental wave propagates in said second-harmonic generation means;
   wherein said optical reflector determines the wavelength of said light of said fundamental wave so that said laser diode produces light with a wavelength satisfying a phase matching condition of said second-harmonic generation means;
   said apparatus further comprising an optical filter for receiving a portion of the light from said optical reflector and filtering out said fundamental wave therefrom.

2. A second-harmonic generating apparatus according to claim 1, wherein said optical reflector comprises a diffraction grating.

3. A second-harmonic generating apparatus according to claim 1, wherein said optical reflector comprises a prism and a mirror.

4. A second-harmonic generating apparatus according to claim 1, wherein said second-harmonic generation means is a waveguide-type element.

5. A second-harmonic generating apparatus according to claim 1, wherein said second-harmonic generation means operates based on quasi-phase matching.

6. A second-harmonic generating apparatus according to claim 1, further comprising a half-wave plate disposed between said antireflective end-facet of said laser diode and said second-harmonic generation means.

7. A second-harmonic generating apparatus comprising:
   a laser diode for providing light of a fundamental wave, having a high reflection coated end-facet and an antireflection coated end-facet;
   an optical reflector for forming an external resonator with said high reflection coated end-facet of said laser diode whereby a portion of the light from said laser diode is returned by said optical reflector to said laser diode; and
   second-harmonic generation means, disposed between said antireflection coated end-facet of said laser diode and said optical reflector, for producing a second-harmonic of said fundamental wave while said fundamental wave propagates in said second-harmonic generation means;
   wherein said optical reflector determines the wavelength of said light of said fundamental wave so that said laser diode produces light with a wavelength satisfying a phase matching condition of said second-harmonic generation means;
   said apparatus further comprising a collimating lens disposed between said optical reflector and said second-harmonic generation means.

8. A second-harmonic generating apparatus according to claim 7, wherein said optical reflector comprises a diffraction grating.

9. A second-harmonic generating apparatus according to claim 7, wherein said optical reflector comprises a prism and a mirror.

10. A second-harmonic generating apparatus comprising:
    a laser diode for providing light of a fundamental wave, having a high reflection coated end-facet and an antireflection coated end-facet;
    an optical reflector for forming an external resonator with said high reflection coated end-facet of said laser diode whereby a portion of the light from said laser diode is returned by said optical reflector to said laser diode; and
    second-harmonic generation means, disposed between said antireflection coated end-facet of said laser diode and said optical reflector, for producing a second-harmonic of said fundamental wave while said fundamental wave propagates in said second-harmonic generation means;
    wherein said optical reflector determines the wavelength of said light of said fundamental wave so that said laser diode produces light with a wavelength satisfying a phase matching condition of said second-harmonic generation means;
    wherein said second-harmonic generation means comprises a substrate having an optical waveguide formed in a surface thereof and extending along an axis thereof, and having a plurality of spaced apart domain-reversing regions formed in said surface as stripes extending orthogonal to said axis.

11. A second-harmonic generating apparatus according to claim 10, wherein said substrate comprises $LiNbO_3$, wherein said domain-reversing regions comprise titanium diffused in said surface of said substrate, and wherein said optical waveguide is formed by a proton exchanging process.

12. A second-harmonic generating apparatus according to claim 10, wherein said domain-reversing regions are spaced apart along said axis by a coherence length $l_c$, the domain-reversing regions having a width along said axis of said coherence length $l_c$, the domain-reversing regions being thereby formed with a spatial period of $2l_c$, whereby the power of the second-harmonic of the fundamental wave is approximately proportional to the square of the length of the optical waveguide.

* * * * *